United States Patent
Hagimoto et al.

(10) Patent No.: US 9,147,650 B2
(45) Date of Patent: Sep. 29, 2015

(54) SEMICONDUCTOR DEVICE, METHOD FOR MANUFACTURING SEMICONDUCTOR DEVICE, AND ELECTRONIC APPARATUS

(71) Applicant: Sony Corporation, Tokyo (JP)

(72) Inventors: Yoshiya Hagimoto, Kanagawa (JP); Nobutoshi Fujii, Kanagawa (JP); Kenichi Aoyagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 44 days.

(21) Appl. No.: 13/755,881

(22) Filed: Jan. 31, 2013

(65) Prior Publication Data
US 2013/0207271 A1 Aug. 15, 2013

(30) Foreign Application Priority Data
Feb. 14, 2012 (JP) .................. 2012-029429

(51) Int. Cl.
| | |
|---|---|
| H01L 23/48 | (2006.01) |
| H01L 23/498 | (2006.01) |
| H01L 21/768 | (2006.01) |
| H01L 27/146 | (2006.01) |
| H01L 23/00 | (2006.01) |
| H01L 25/065 | (2006.01) |
| H01L 25/00 | (2006.01) |

(52) U.S. Cl.
CPC ........ *H01L 23/498* (2013.01); *H01L 21/76829* (2013.01); *H01L 21/76849* (2013.01); *H01L 21/76885* (2013.01); *H01L 23/49866* (2013.01); *H01L 24/03* (2013.01); *H01L 24/05* (2013.01); *H01L 24/08* (2013.01); *H01L 24/80* (2013.01); *H01L 25/0657* (2013.01); *H01L 25/50* (2013.01); *H01L 27/1464* (2013.01); *H01L 27/14634* (2013.01); *H01L 2224/03845* (2013.01); *H01L 2224/05026* (2013.01); *H01L 2224/05147* (2013.01); *H01L 2224/05562* (2013.01); *H01L 2224/05666* (2013.01); *H01L 2224/05681* (2013.01); *H01L 2224/081* (2013.01); *H01L 2224/08147* (2013.01); *H01L 2224/08501* (2013.01); *H01L 2224/09181* (2013.01); *H01L 2224/80895* (2013.01); *H01L 2225/06524* (2013.01); *H01L 2924/00014* (2013.01); *H01L 2924/13091* (2013.01); *H01L 2924/15321* (2013.01); *H01L 2924/15331* (2013.01)

(58) Field of Classification Search
CPC ............... H01L 24/83; H01L 24/89; H01L 2924/01022; H01L 2924/01073
USPC ................................... 257/782, 783
See application file for complete search history.

(56) References Cited

U.S. PATENT DOCUMENTS

2013/0113106 A1* 5/2013 Nguyen .................. 257/753
2014/0117546 A1* 5/2014 Liu et al. ................. 257/751

FOREIGN PATENT DOCUMENTS

| JP | 01-205465 | 8/1989 |
| JP | 2006-191081 A | 7/2006 |

* cited by examiner

*Primary Examiner* — Daniel Whalen
(74) *Attorney, Agent, or Firm* — Fishman Stewart Yamaguchi PLLC

(57) ABSTRACT

There is provided a semiconductor device, including a semiconductor substrate, an interlayer insulating layer formed on the semiconductor substrate, a bonding electrode formed on a surface of the interlayer insulating layer, and a metal film which covers an entire surface of a bonding surface including the interlayer insulating layer and the bonding electrode.

16 Claims, 8 Drawing Sheets

G

H

SEMICONDUCTOR DEVICE, METHOD FOR MANUFACTURING SEMICONDUCTOR DEVICE, AND ELECTRONIC APPARATUS

BACKGROUND

The present disclosure relates to a semiconductor device, a method for manufacturing a semiconductor device, and an electronic apparatus, which performs wire bonding by laminating substrates.

High integration of semiconductor devices has been achieved in two dimensional LSI by the introduction of fine processes and improvements in package density. In recent years, a physical limitation of the refinements has started to be seen, and three dimensional LSI technologies have been gathering attention.

Bonding technology is a base technology in three dimensional LSI. There are a variety of systems within bonding technology, and technologies which bond chips to each other and technologies which bond wafers to each other have been considered. When a three dimensional LSI is fabricated by laminating device wafers together, there is a system of directly bonding Cu electrodes of the device side, which are formed on the wafer surface, with each other. In this system, there is a method which flattens the CU electrodes and an interlayer dielectric (ILD) so as to be on the same plane, and which performs hybrid bonding of Cu/ILD (Refer to JP 2006-191081A and JP H1-205465A). In such a bonding process, it may be necessary for the bonding surfaces to be extremely planar surfaces, in order to improve the bonding strength and to control bonding defects.

SUMMARY

In the above described semiconductor device in which semiconductor substrates are directly bonded to one another, it may be necessary to improve the bond reliability.

The present disclosure provides a highly reliable semiconductor device, method for manufacturing a semiconductor device, and an electronic apparatus.

According to an embodiment of the present technology, there is provided a semiconductor device, including a semiconductor substrate, an interlayer insulating layer formed on the semiconductor substrate, a bonding electrode formed on a surface of the interlayer insulating layer, and a metal film which covers an entire surface of a bonding surface including the interlayer insulating layer and the bonding electrode.

Further, the electronic apparatus of the embodiment of the present disclosure includes the above described semiconductor device, and a signal processing circuit which processes an output signal of the semiconductor device.

According to an embodiment of the present technology, there is provided a method for manufacturing a semiconductor device, including forming an interlayer insulating layer on a semiconductor substrate, forming a bonding electrode on a surface of the interlayer insulating layer, and forming a metal film on an entire surface of the interlayer insulating layer and the bonding electrode.

According to an embodiment of the present technology, there is provided a semiconductor device including a first semiconductor substrate and a second semiconductor substrate which are formed by laminating surfaces of bonding electrodes through metal films, the semiconductor device including the first semiconductor substrate, a first interlayer insulating layer formed on the first semiconductor substrate, a first bonding electrode formed on a surface of the first interlayer insulating layer, the second semiconductor substrate bonded to the first semiconductor substrate, a second interlayer insulating layer formed on the second semiconductor substrate, a second bonding electrode formed on a surface of the second interlayer insulating layer, a metal film formed on a bonding surface between the first semiconductor substrate and the second semiconductor substrate, and between the first bonding electrode and the second bonding electrode, and an insulating film which is formed on the bonding surface between the first semiconductor substrate and the second semiconductor substrate, and on a part in contact with the first interlayer insulating layer or the second interlayer insulating layer, and which includes a reaction product between the metal film and the first interlayer insulating layer or the second interlayer insulating layer.

According to the above described semiconductor device of the embodiment of the present disclosure, and a semiconductor device manufactured by the above described manufacturing method, a metal film is formed on the surface where an interlayer insulating layer and bonding electrodes of a semiconductor substrate are formed. When this semiconductor substrate is bonded to another semiconductor substrate at the surface where the bonding electrodes are formed, the interlayer insulating layer and the metal film react due to heating of the bonding surfaces, and an insulating film is formed. Further, the metal film formed on the bonding electrodes is maintained in the state prior to heating without reaction.

Further, an electrical connection between the bonding electrodes is secured by the metal film on the bonding electrodes. Contact between the interlayer insulating layer and the bonding electrodes is prevented due to an insulating layer as a reaction product of the metal film, and a reduction in reliability, such as from bonding defects or leak paths, is controlled.

In addition, the reliability of an electronic apparatus to which this semiconductor device is applied can be improved.

According to the embodiment of the present disclosure, a highly reliable semiconductor device, method for manufacturing a semiconductor device, and an electronic apparatus, can be provided.

DETAILED DESCRIPTION OF THE EMBODIMENT(S)

Figure 1:
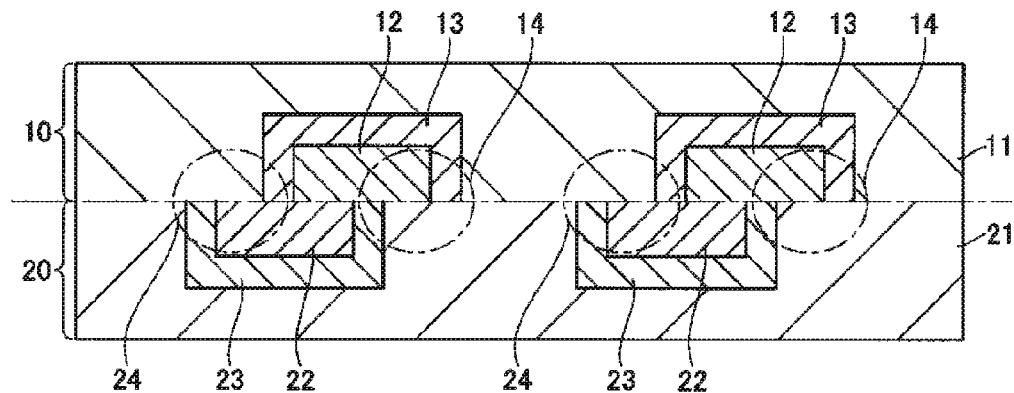
FIG. 1 is a cross-sectional figure which shows a schematic configuration of bonding electrodes.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, while example embodiments for implementing the present disclosure will be described, the present disclosure is not limited to these examples.

Note that the description will be made in the following order.

1. Outline of a semiconductor device
2. Embodiments of the semiconductor device
3. Method for manufacturing the semiconductor devices of the embodiments
4. Modified example of the semiconductor devices
5. Embodiments of an electronic apparatus

1. Outline of a Semiconductor Device

[Configuration]

An outline of the configuration of bonding electrodes of a semiconductor device will be described.

FIG. 1 shows a cross-sectional figure with the configuration of a bonding section of a general semiconductor device of the related art. For this bonding section, there is a configuration of a plurality of semiconductor substrates, in which the wiring layers formed on each of the surfaces are opposite one another, and bonding electrodes formed on the surfaces of the wiring layers are bonded to one other.

The bonding section shown in FIG. 1 denotes a state in which a first bonding section 10 and a second bonding section 20 are bonded together.

The first bonding section 10 is formed on a semiconductor substrate, which is not shown in the figure. Also, the first bonding section 10 includes a first interlayer insulating layer 11, and first bonding electrodes 12. The first bonding electrodes 12 are formed within the first interlayer insulating layer 11, and the surface of the first bonding electrodes 12 is exposed from the surface of the first interlayer insulating layer 11 on bonding surfaces. A barrier metal surface 13, for preventing diffusion to the insulating layer of the electrode material, is arranged on the surfaces in contact between the first bonding electrodes 12 and the first interlayer insulating layer 11.

The second bonding section 20 is formed on a semiconductor substrate, which is not shown in the figure, different from that of the above described first bonding section 10. Also, the second bonding section 20 includes a second interlayer insulating layer 21 and second bonding electrodes 22. The second bonding electrodes 22 are formed within the second interlayer insulating layer 21, and the surface of the second bonding electrodes 22 is exposed from the surface of the second interlayer insulating layer 21 on bonding surfaces. Further, a barrier metal surface 23, for preventing diffusion to the insulating layer of the electrode material, is arranged on the surfaces in contact between the second interlayer insulating layer 21 and the second bonding electrodes 22.

[Problem]

As described above, in a state where the surfaces on which the first bonding electrodes 12 are formed and the surfaces on which the second bonding electrodes 22 are formed oppose one another, the first bonding electrodes 12 and the second bonding electrodes 22 are bonded to one another, and the first bonding section 10 and the second bonding section 20 are laminated together. Here, the first bonding electrodes 12 and the second bonding electrodes 22 are bonded to one another in a deviated state where the bonding surfaces and the surfaces on which the electrodes are formed do not completely match.

Further, the first bonding electrodes 12 and the second bonding electrodes 22 are designed so that a difference in bonding areas is not generated, even in the case where the bonding position is deviated, by forming a large area on one of the electrodes so as to secure bond reliability.

Therefore, on the bonding surfaces there is a part where the bonding electrodes come into contact, and there is a part where the bonding electrodes and the interlayer insulating layer come into contact. That is, at the bonding surfaces of this semiconductor device, there is a contact section 14 where the first bonding electrodes 12 and the second interlayer insulating layer 21 come into contact. In addition, there is a contact section 24 where the second bonding electrodes 22 and the first interlayer insulating layer 11 come into contact.

At the contact sections 14 and 24, the bonding property is low since different materials are in contact with each other, such as the metal material which constitutes the bonding electrodes and an inorganic oxide or the like which constitutes the interlayer insulating layers. When such a bonding property is low, there are cases where a void (hole) will be generated in the interface between the first bonding electrodes 12 and the second interlayer insulating layer 21, and in the interface between the second bonding electrodes 22 and the first interlayer insulating layer 11. In this case, a problem may occur in the bonding property of the semiconductor device, such as deterioration of the bonding property.

Figure 2:
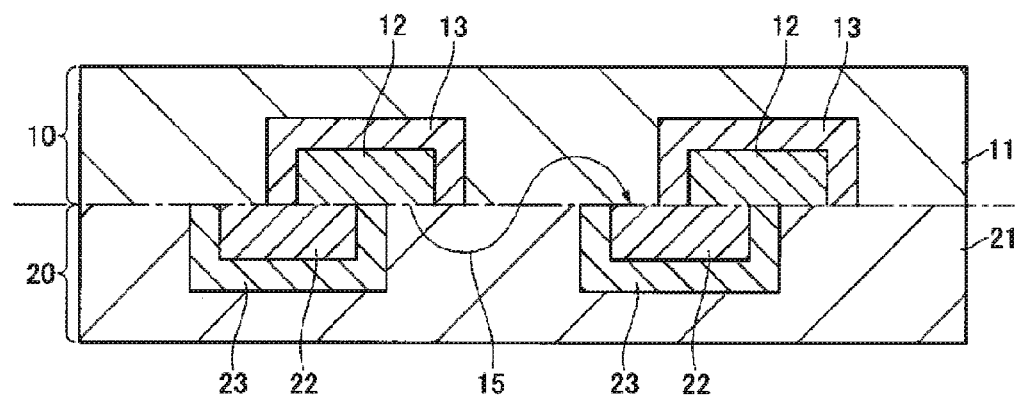
FIG. 2 is a cross-sectional figure which shows a schematic configuration of bonding electrodes.

Further, as shown in FIG. 2, there is a possibility that a leak path 15 will form due to diffusion into the interlayer insulating layer of the metal, for example Cu, which constitutes the bonding electrodes. This causes defects in the insulating property of the semiconductor device and problems in the barrier property.

In the bonding of the semiconductor substrates, if there is a configuration in which the bonding electrodes and the interlayer insulating layer are not in contact with each other, by exactly matching and bonding the bonding electrodes of the bonding interface, the above described problem will not occur. However, it is difficult to eliminate the occurrence of a very slight deviation when bonding. Accordingly, it is difficult to improve the bonding property by preventing a position deviation of bonding.

In addition, since the bonding areas of vertical bonding electrodes may not be structurally identical, there will inevitably be a surface in contact between the bonding electrodes and the interlayer insulating layer.

Therefore, in semiconductor devices bonded by bonding electrodes, a configuration which prevents deterioration of the bonding property and deterioration of the barrier property may be necessary, even in a state where position deviation has occurred.

2. Embodiments of the Semiconductor Device

[Configuration of the Semiconductor Device]

Hereinafter, embodiments of the semiconductor device which includes bonding electrodes will be described.

Figure 3:
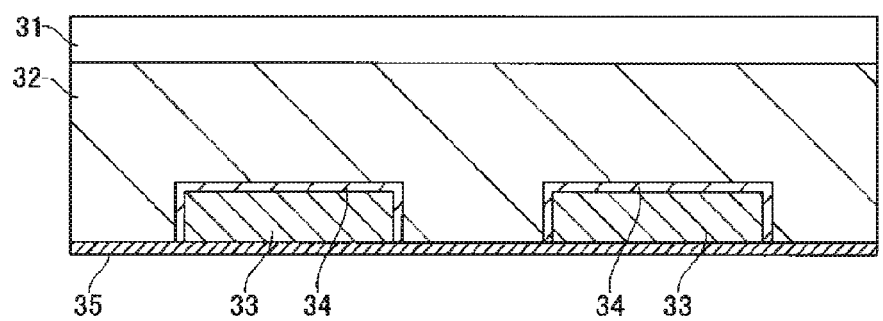
FIG. 3 is a cross-sectional figure which shows a schematic configuration of a semiconductor device which includes bonding electrodes of the embodiments.

FIG. 3 shows a schematic configuration of the semiconductor device which includes bonding electrodes of the embodiment of the present embodiment. FIG. 3 is a cross-sectional figure in the vicinity of a bonding section of the semiconductor device of the embodiment of the present embodiment. Note that in the above described semiconductor device 30 shown in FIG. 3, a description of unnecessary wiring layers and the like will be omitted from the description of the present embodiment.

As shown in FIG. 3, the semiconductor device 30 includes an interlayer insulating layer 32 formed on a semiconductor substrate 31, and bonding electrodes 33 formed on the surface of this interlayer insulating layer 32. In addition, a metal film 35 is included which covers the interlayer insulating layer 32 and the surface of the bonding electrodes 33.

Various elements such as electronic circuits and wiring, which are not shown in the figure, are formed on the semiconductor substrate 31.

The layer formed on the outermost surface of the interlayer insulating layer 32 is composed, for example, from an oxide such as SiO, HfO, GeO, GaO or SiON, or from a nitride insulating layer and a metallic oxide. The other layers can use materials applied to an interlayer insulating layer of a semiconductor device which are well-known in the related art. The bonding electrodes 33 are formed from a material, for example Cu, applied to the electrodes of the semiconductor device which is well-known in the related art.

A barrier surface layer 34 is formed from a material, for example Ta, Ti, Ru, TaN, TiN or the like, applied generally as a barrier metal layer in a semiconductor device.

The metal film 35 is formed by covering the entire surface of the semiconductor device 30.

Further, it is possible for the metal film 35 to be bonded to the semiconductor substrate by heat treatment, and a metal with a high conductivity can be used. In addition, the metal film 35 uses a metal which reacts with the interlayer insulating layer 32, in the parts in contact with the interlayer insulating layer 32, by heat treatment. Also, a metal is used in which a reaction product of the metal film 35 becomes an insulator, which is generated by this reaction on the parts in contact with the interlayer insulating layer 32. For example, Ti, Ta or the like are used as such a metal in the metal film 35.

Further, the metal film 35 is formed with a thickness at which all parts in contact with the interlayer insulating layer 32 become a reaction product due to the above described reaction. This is the thickness at which a conductive layer does not remain on the surface of the parts in contact with the interlayer insulating layer 32, after heat treatment. If a conductive layer remains on the surface, it will cause an increase in short circuits and leak currents between adjacent electrodes. Accordingly, while there is a difference due to the combination of materials and the heat treatment condition, it is possible to have an entire reaction up to the surface by making the thickness of the metal film 35 equal to or less than 100 nm. Further, it is possible for the above described characteristics to be favorably expressed by making the film thickness equal to or less than 20 nm.

Further, the metal film 35 is formed to a thickness at which the reaction product with the interlayer insulating layer 32 has a sufficient barrier property, for example, a thickness equal to or more than 5 molecular layers.

[Bonding of Semiconductor Devices]

Figure 4:
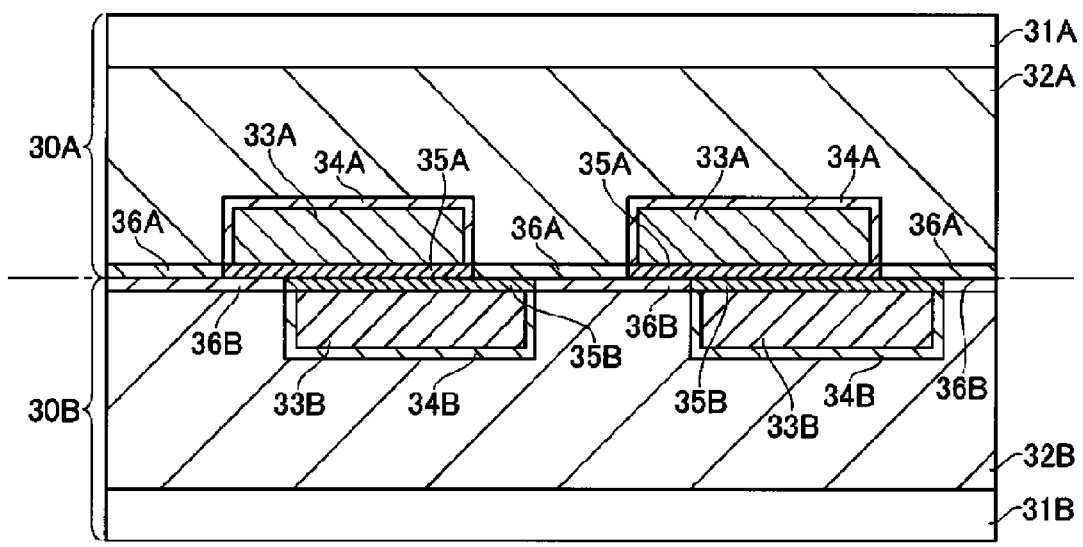
FIG. 4 is a cross-sectional figure which shows a schematic configuration of semiconductor devices which include bonding electrodes of the embodiments.

Next, FIG. 4 shows a configuration in which two of the above described semiconductor devices 30 are laminated together. FIG. 4 shows semiconductor devices 30A and 30B, which have the same configuration. The semiconductor devices 30A and 30B are configured the same as the above described semiconductor device 30 shown in FIG. 3, and are shown by attaching A and B to the respective reference numerals. Further, since each part of the semiconductor devices 30A and 30B has a configuration the same as the above described semiconductor device 30 shown in FIG. 3, a description of them will be omitted.

Bonding between the semiconductor device 30A and the semiconductor device 30B is performed on the surfaces where the bonding electrodes 33A and 33B are formed, by metal films 35A and 35B arranged on the surface of the wiring forming side. The semiconductor substrates are laminated together through the bonding electrodes 33A and 33B by this bonding. Further, the semiconductor device 30A and the semiconductor device 30B are bonded in a state where the planar position between the bonding electrode 33A and the bonding electrode 33B has been deviated.

The wiring forming surfaces of the semiconductor substrates 31A and 31B are opposed to each other, and thereafter the above described bonding between the semiconductor device 30A and the semiconductor device 30B contacts both of them. Also, heat treatment is performed at a state where the metal film 35A and the metal film 35B are in contact with each other, and the metal film 35A and the metal film 35B are bonded to one another. The semiconductor substrates 31A and 31B are laminated together by heating at the state where the metal films 35A and 35B are in contact with each other.

Further, a reaction occurs in the parts where the metal films 35A and 35B are in contact with the interlayer insulating layers 32A and 32B, by the heat applied during bonding. When this reaction occurs, an insulator, which is a reaction product between the metal film and the interlayer insulating layer, is generated in the parts where the metals films 35A and 35B are in contact with the interlayer insulating layers 32A and 32B. Accordingly, the parts formed on the interlayer insulating layers 32A and 32B in the metal films 35A and 35B will form insulating films 36A and 36B due to the reaction product.

Further, the metal films 35A and 35B formed on the bonding electrodes 33A and 33B maintain the state of a formed film without change after the heat treatment.

For example, in the case where $SiO_2$ is used in the interlayer insulating layer 32A and Ti is used in the metal film 35A, a metallic oxide layer, which includes $TiO_2$ due to the above described reaction, will be formed on the interlayer insulating layer 32 as the insulating film 36A. $TiO_2$ has a high bather property or a high insulation property in order to be used as a general barrier metal.

Contact does not occur between the bonding electrodes 33A and 33B and the interlayer insulating layers 32A and 32B, where the bonding property is low, due to the interlayer insulating layers 32A and 32B being covered by the insulating films 36A and 36B. Accordingly, a void is not generated in the bonding interface. Therefore, the reliability of bonding the semiconductor devices is improved. In addition, diffusion into the interlayer insulating layers 32A and 32B of the metal, for example Cu, which constitutes the bonding electrodes 33A and 33B can be prevented. Accordingly, the formation of a leak path is controlled, and the reliability of the semiconductor devices is improved.

Note that the metal films 35A and 35B may be bonded to both of the bonded semiconductor devices 30A and 30B, by using identical metal materials, or by using different materials such as Ti and Ta. Even in the case of bonding by using different materials, it is possible to bond the metals films 35A and 35B to each other, and when the metal film 35 in contact with the interlayer insulating layer 32 becomes an insulating layer 36, the above described effect can be obtained.

3. Method for Manufacturing the Semiconductor Devices

Next, an example of a method for manufacturing the semiconductor device of the embodiments will be described. Note that the following description of the manufacturing method will only show the manufacturing method in the vicinity of the bonding section of the above described semiconductor device 30 shown in FIG. 3, and a description of other manufacturing methods for the configurations of the various elements, wiring or the like formed on the semiconductor substrate 31 will be omitted. A description of the fabrication methods for the semiconductor substrates, wiring layers, other various transistors and the various elements will be omitted. These parts can be fabricated by well-known methods of the related art. Further, the same reference numerals are attached to configurations similar to those of the semiconductor devices of the above described embodiments shown in FIGS. 3 and 4, and a detailed description of each of these configurations will be omitted.

Figure 5:
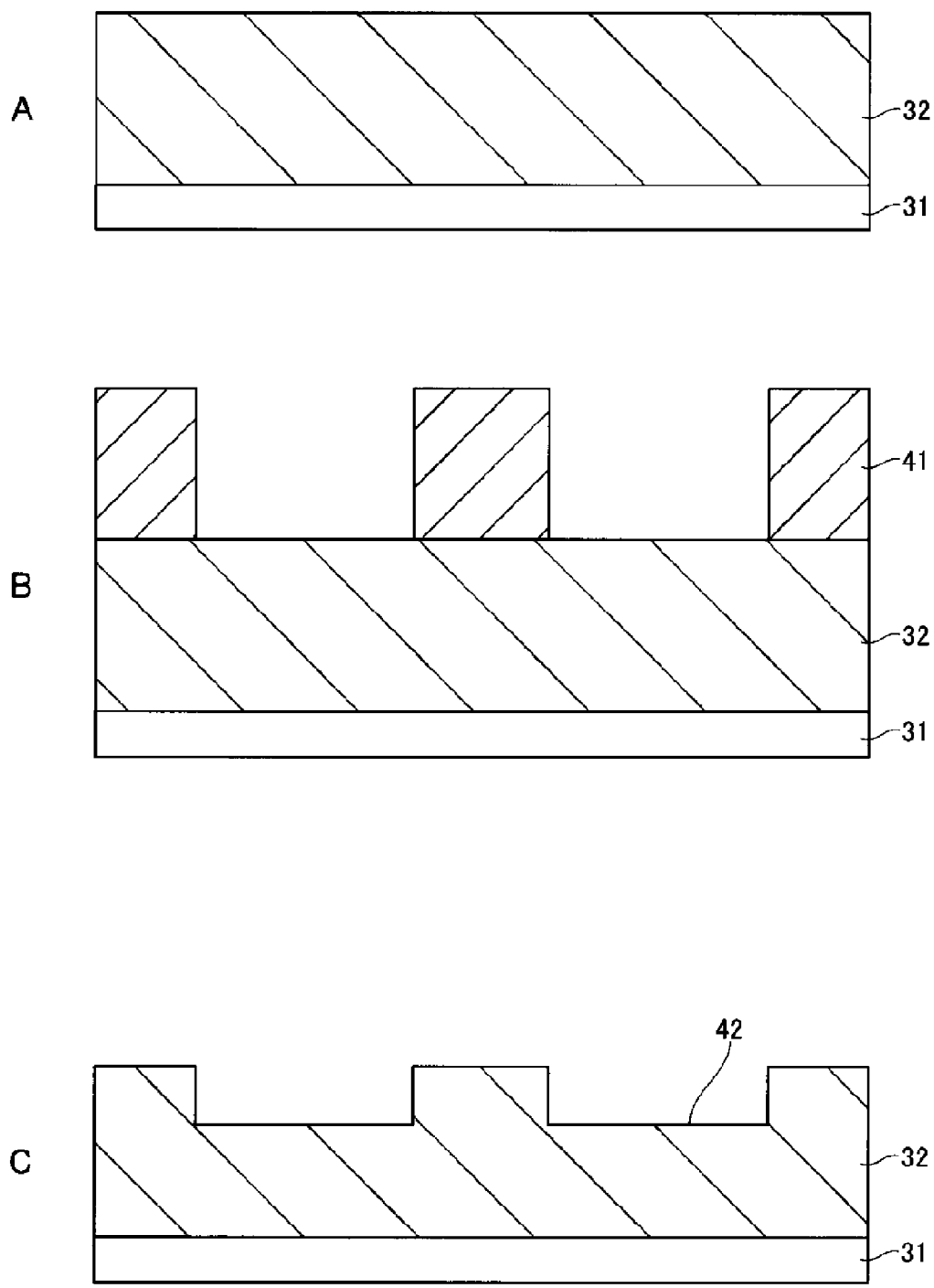
FIGS. 5A-5C are manufacturing process charts of semiconductor devices which include bonding electrodes of the embodiments.

First, as shown in FIG. 5A, an interlayer insulation layer 32 is formed on a semiconductor substrate 31, on which various elements are formed. The interlayer insulation layer 32 is formed by a plurality of interlayer insulating layers, wiring or the like. The figures are shown by omitting the stacking of the interlayer insulating layers, wiring layers or the like.

Then, as shown in FIG. 5B, resist layers 41 are formed on the interlayer insulation layer 32. The resist layers 41 are formed in a pattern which opens positions for forming the bonding electrodes of the semiconductor device.

As shown in FIG. 5C, the interlayer insulating layer 32 is etched to a prescribed depth, by a dry etching method which uses an etching device of a general magnetron system from above the resist layers 41, and open sections 42 are formed on the surface of the interlayer insulating layer 32. After the etching process, an ashing process based on oxygen ($O_2$) plasma, for example, and a chemical process of an organic amine system are applied as necessary, and the surface of the interlayer insulating layer 32 is washed.

Figure 6:
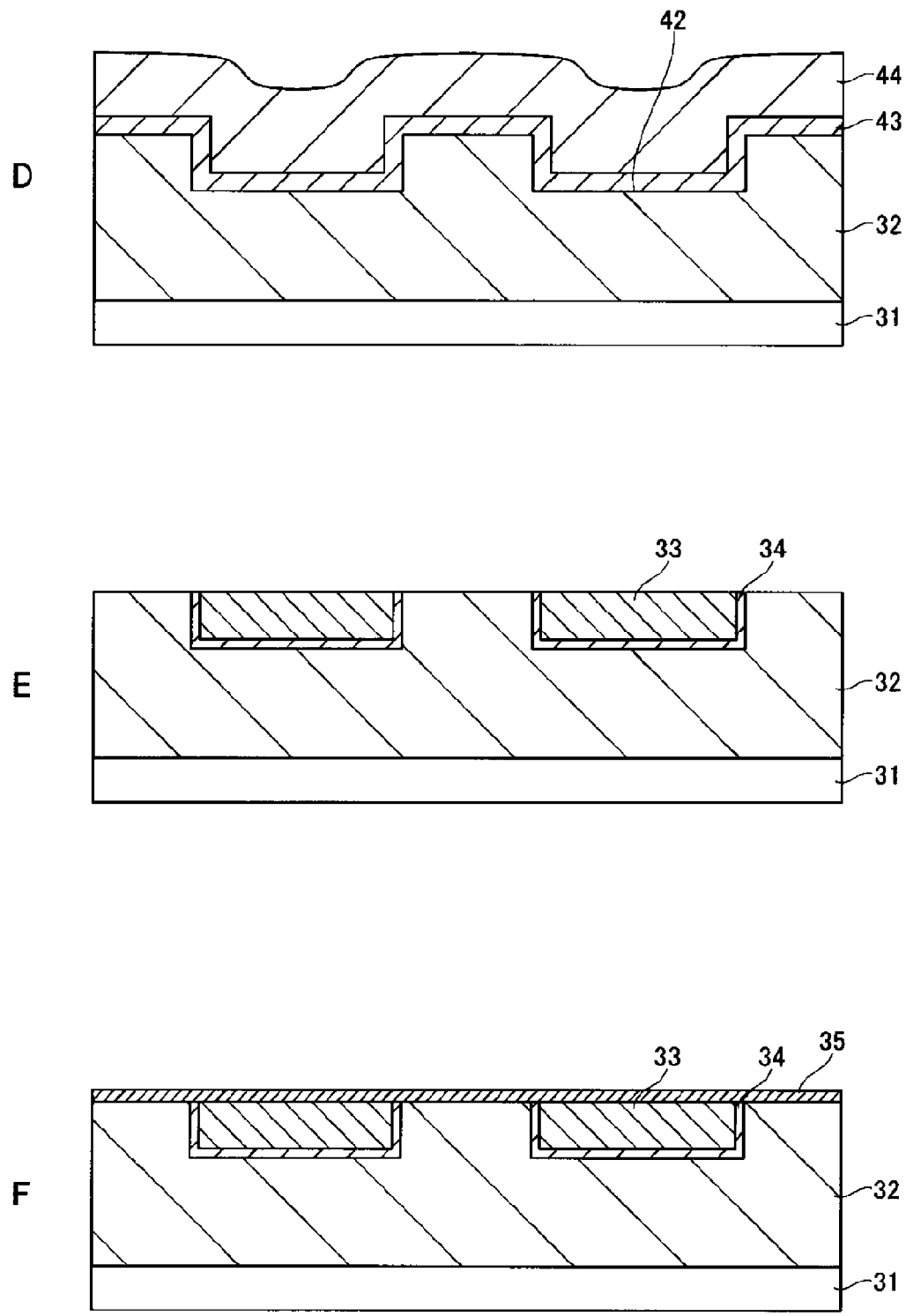
FIGS. 6D-6F are manufacturing process charts of semiconductor devices which include bonding electrodes of the embodiments.

Next, as shown in FIG. 6D, a barrier material layer 43 and an electrode material layer 44 are formed, so as to form barrier metal layers and bonding electrodes. The barrier material layer 43 is formed to 5-50 nm using Ta, Ti, Ru, TaN or the like under an $Ar/N_2$ atmosphere, by an RF sputtering process. The electrode material layer 44 is formed with Cu or the like on the barrier material layer 43, by using an electroplating method or a sputtering method. The electrode material layer 44 is formed by embedding the formed open sections 42. Then, after the formation of the electrode material layer 44, heat treatment is performed for approximately 1-60 minutes at 100° C. to 400° C., by using a hot plate or a sinter-annealing device.

Next, unnecessary parts are removed as a wiring pattern by a Chemical-Mechanical Planarization (CMP) method, from among the deposited barrier material layer 43 and the electrode material layer 44. By this process, as shown in FIG. 6E, barrier metal layers 34 and bonding electrodes 33 are formed.

Then, as shown in FIG. 6F, a metal film 35 is formed on the entire surface by covering the surface of the bonding electrodes 33 and the interlayer insulating layer 32. The metal film 35 forms a material, such as Ti or Ta, to a thickness of 10-100 nm by using an ALD (Atomic Layer Deposition) method or a CVD (Chemical Vapor Deposition) method.

After the formation of the metal film 35, a flattening process is performed on the surface by using a CMP method or the like as necessary.

According to the above described process, the semiconductor device 30 can be formed.

Further, processes similar to the above described method in FIGS. 5A to 6F are repeated, and a pair of semiconductor devices 30 are prepared.

Then, a Wet process which uses formic acid, for example, or a Dry process which uses plasma such as Ar, $NH_3$ or $H_2$, is applied to the bonding surfaces of the two semiconductor devices 30 formed by the above described method. An oxide film on the surface of the bonding electrodes 33 is removed by this process, and a clean metal surface is exposed.

Figure 7:
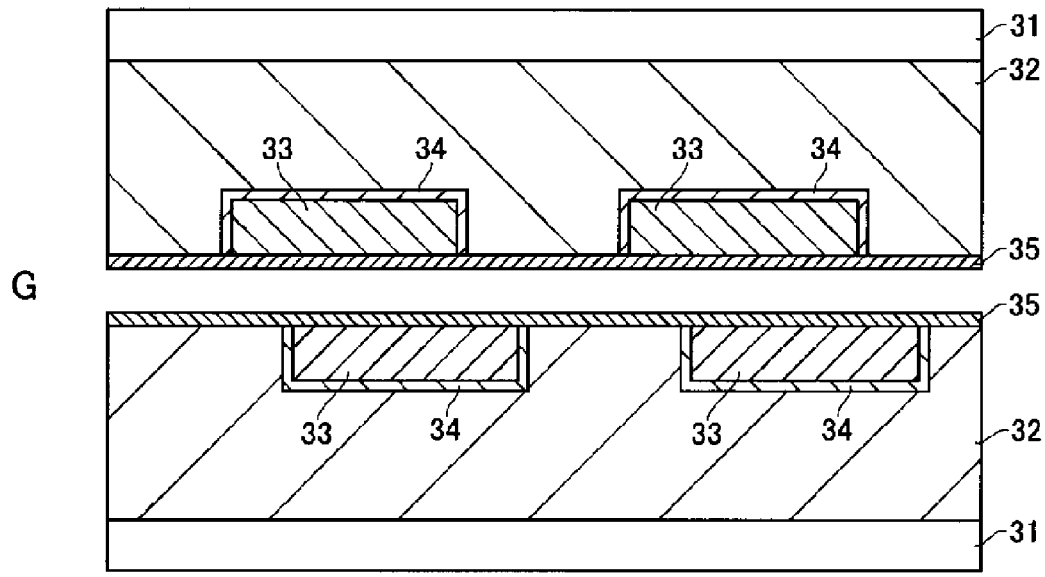
FIGS. 7G-7H are manufacturing process charts of semiconductor devices which include bonding electrodes of the embodiments.
Figure 7:
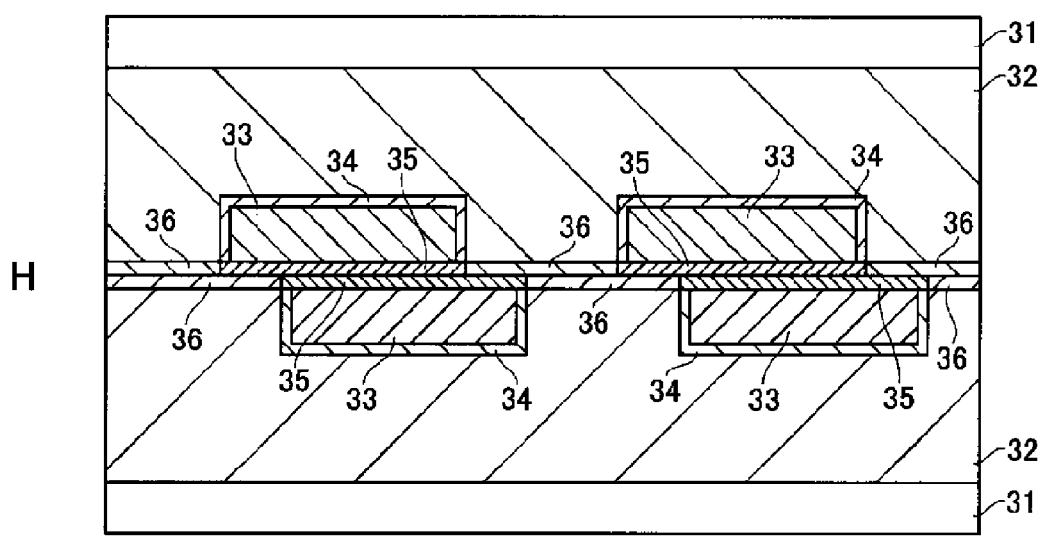

Then, as shown in FIG. 7G, the surfaces of the two semiconductor devices are placed opposite one another. Then, both of the semiconductor devices are brought into contact with one another. In such a state, both the metal films 35 do not change from the material at the time of film formation, and the entire surface of both the semiconductor devices 30 are covered.

At that time, heat treatment is performed for approximately 5 minutes to 2 hours at 100° C. to 400° C., in an $N_2$ atmosphere at atmospheric pressure or within a vacuum, for example, by an annealing device such as a hot plate or an RTA.

By such a heat treatment, the metal film 35 of the parts in contact with the interlayer insulating layer 32 reacts. In this way, an insulating film 36, which includes a reaction product, is formed on the bonding surfaces of both the semiconductor devices 30. In this way, at the same time as the bonding of the semiconductor devices 30, the metal film 35 and the interlayer insulating layer 32 reacts, and it is possible to form the insulating film 36.

According to the above described process, the semiconductor devices of the present embodiment shown in FIG. 7H can be manufactured.

Note that the formation of the insulating film 36 may be performed in a process different to that of the bonding of the semiconductor devices 30. For example, after the metal film 35 has been formed in FIG. 6F, heat treatment may be performed on the semiconductor devices 30, and the insulating film 36 may be formed.

4. Modified Example of the Semiconductor Devices

Next, a modified example of the semiconductor devices of the above described embodiments will be described.

Figure 8:
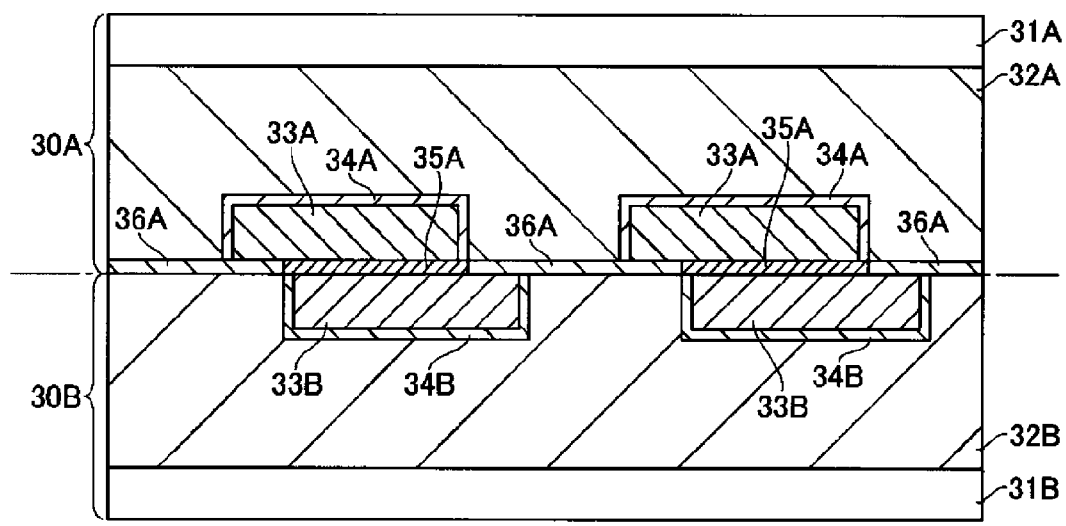
FIG. 8 is a cross-sectional figure which shows a schematic configuration of a modified example of semiconductor devices which include bonding electrodes.

FIG. 8 shows a configuration of the semiconductor devices of the modified example. The semiconductor devices shown in FIG. 8 have a configuration similar to the above described semiconductor devices shown in FIG. 4, except for the configuration of the metal films formed on the bonding surfaces. Accordingly, the same reference numerals are attached to configurations similar to those of the semiconductor device shown in FIG. 4, and a description of them will be omitted.

For the semiconductor devices 50 shown in FIG. 8, one layer of the metal film 35 is formed on the bonding surfaces. In this way, the semiconductor devices of the present embodiment may have a configuration where a metal film is formed only on the bonding surfaces of one semiconductor device, and a metal film is not formed on the bonding surfaces of the other semiconductor device. For example, the semiconductor devices with the configuration shown in FIG. 8 have a configuration where a metal film 35A is formed on the bonding surfaces of the semiconductor device 30A, and a metal film is not formed on the bonding surfaces of the semiconductor device 30B.

Then, after the semiconductor device 30A and the semiconductor device 30B have been laminated together, the metal film 35A of the parts in contact with the interlayer insulating layers 32A and 32B reacts due to performing heat treatment, and becomes an insulating film 36A.

In the semiconductor devices 50 with the configuration shown in FIG. 8, while the metal film 35A of the parts in contact with the interlayer insulating layers 32A and 32B becomes the insulating film 36A, the metal film 35A of the position placed between the bonding electrodes 33A and the bonding electrodes 33B does not change into an insulating film. Accordingly, conduction between the bonding electrodes 33A and the bonding electrodes 33B can be secured by the metal film 35A.

Further, since the metal film 35A of the parts in contact with the interlayer insulating layers 32A and 32B becomes the insulating film 36A, the top of the interlayer insulating layers 32A and 32B are covered by the insulating film 36A. As a result, contact does not occur between the bonding electrodes 33A and 33B and the interlayer insulating layers 32A and 32B, where the bonding property is low, and a reduction in the reliability of the bonding of the semiconductor devices, due to the generation of a void in the bonding interface, can be controlled.

In addition, diffusion into the interlayer insulating layers 32A and 32B of the metal, for example Cu, which constitutes the bonding electrodes 33A and 33B, can be prevented by the insulating film 36A covering the top of the insulating layers 32A and 32B. Accordingly, the formation of a leak pass is controlled, and the reliability of the semiconductor devices is improved.

5. Embodiments of an Electronic Apparatus

It is possible to apply the semiconductor devices of the above described embodiments to an arbitrary electronic apparatus, for example, a solid-state imaging apparatus, a semiconductor memory, or a semiconductor logic device (such as an IC), which performs wire bonding by laminating two semiconductor members together.

[Solid-State Imaging Apparatus]

Hereinafter, an example of applying the configuration of electrode bonding in the above described embodiments to a solid-state imaging apparatus will be described.

Figure 9:
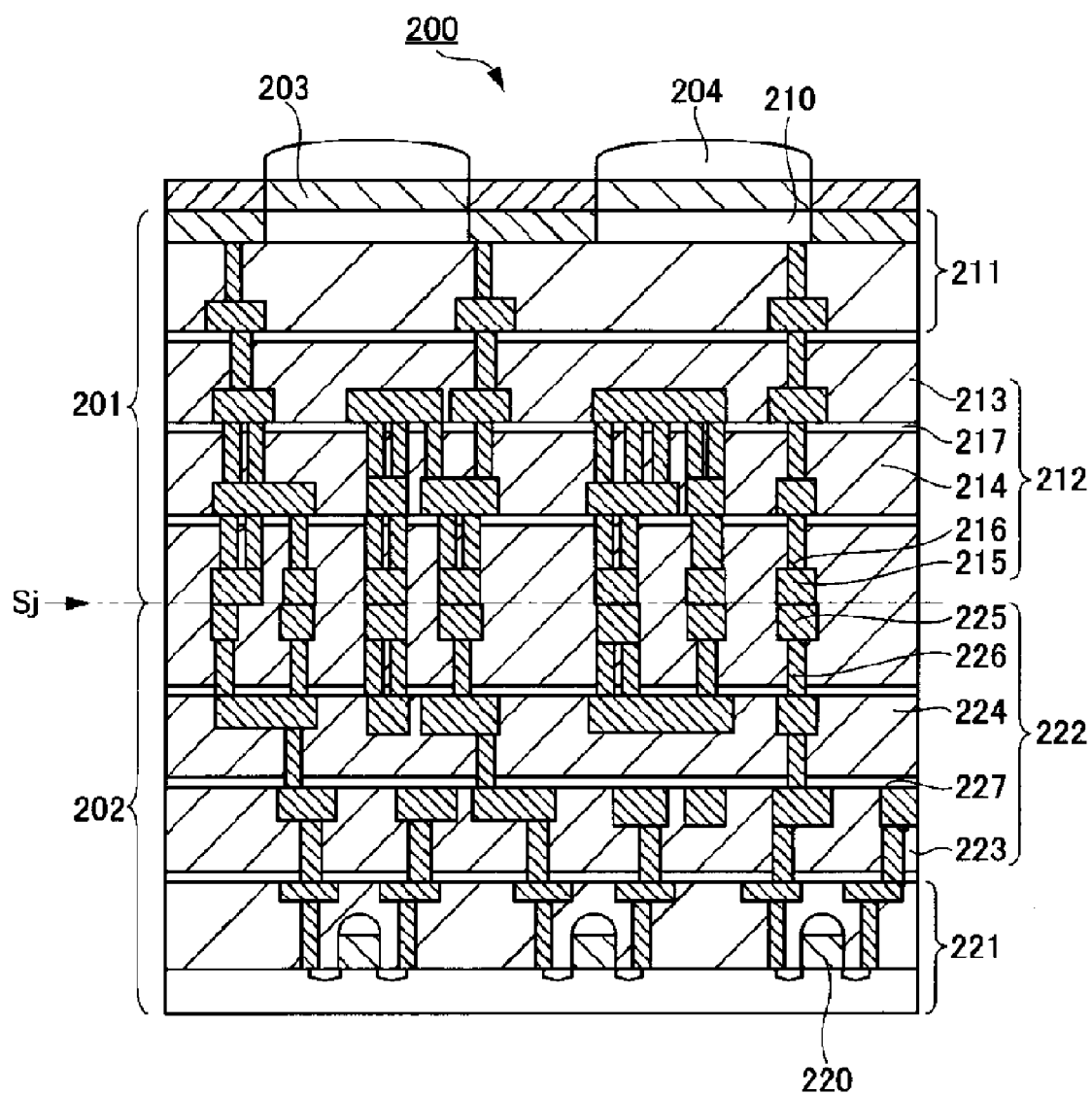
FIG. 9 is a figure which shows a configuration of a solid-state imaging apparatus.

FIG. 9 shows a schematic cross-sectional figure of the main sections of a solid-state imaging apparatus according to the embodiment of the present embodiment. Note that in order to simplify the description in FIG. 9, the parts showing the barrier metal layer formed between the electrode bonding sections, vias, and interlayer insulating layers will be omitted.

The solid-state imaging apparatus 200 of the present embodiment includes a first semiconductor member 201 which has a photoelectric conversion section 210, and a second semiconductor member 202 which has various MOS (Metal-Oxide-Semiconductor) transistors 220 constituting an operation circuit. Further, the solid-state imaging apparatus 200 includes a color filter 203 and an on-chip micro lens 204.

In the solid-state imaging apparatus 200 of the present embodiment, the first semiconductor member 201 and the second semiconductor member 202 are bonded together at a bonding interface. Further, in the present embodiment, the color filter 203 and the on-chip micro lens 204 are stacked in this order on the top surface of the first semiconductor member 201 opposite to the side of the second semiconductor member 202 (on a photoelectric conversion layer 211).

The first semiconductor member 201 includes a photoelectric conversion layer 211 which has a photoelectric conversion section 210, and a first multilayer wiring section 212 arranged on the side of the photoelectric conversion layer 211 opposite the color filter 203.

The first multilayer wiring section 212 is configured by stacking a plurality of wiring layers 213. Each of the wiring layers 213 has an interlayer insulating layer 214, first bonding sections 215 embedded within the interlayer insulating layer 214, and vias 216 arranged for obtaining an electrical connection between layers (wiring layers 213 or the photoelectric conversion layer 211) positioned from the layers themselves to the color filter 203 side. Further, in the present embodiment, an intermediate layer 217 is arranged between mutually adjoining wiring layers 213, and between the wiring layers 213 and the photoelectric conversion layer 211.

On the other hand, the second semiconductor member 202 includes a transistor section 221 in which various MOS transistors 220 constituting an operation circuit are formed, and a second multilayer wiring section 222 arranged on the side of the transistor section 221 towards the first semiconductor member 201.

The second multilayer wiring section 222 is configured by stacking a plurality of wiring layers 223. Each of the wiring layers 223 has an interlayer insulating layer 224, second bonding sections 225 embedded within the interlayer insulating layer 224, and vias 226 arranged for obtaining an electrical connection between layers (wiring layers 223 or the transistor section 221) positioned from the layers themselves to the transistor section 221 side. Further, in the present embodiment, an intermediate layer 227 is arranged between mutually adjoining wiring layers 223, and between the wiring layers 223 and the transistor section 221.

In the solid-state imaging apparatus 200 with the above described configuration, the configuration of the first bonding section and the second bonding section from any of the above described embodiments 1-3 are respectively applied to the first bonding section 215 and the second bonding section 225, which are bonded across a bonding surface. In this case, a solid-state imaging apparatus 200 can be obtained which has a more highly reliable bonding surface.

[Camera]

The above described solid-state imaging apparatus can be applied to an electronic apparatus, such as a camera system of a digital camera, a video camera or the like, a mobile phone which has an imaging function, or another apparatus which includes an imaging function. Hereinafter, a camera for example will be described as an example configuration of an electronic apparatus.

Figure 10:
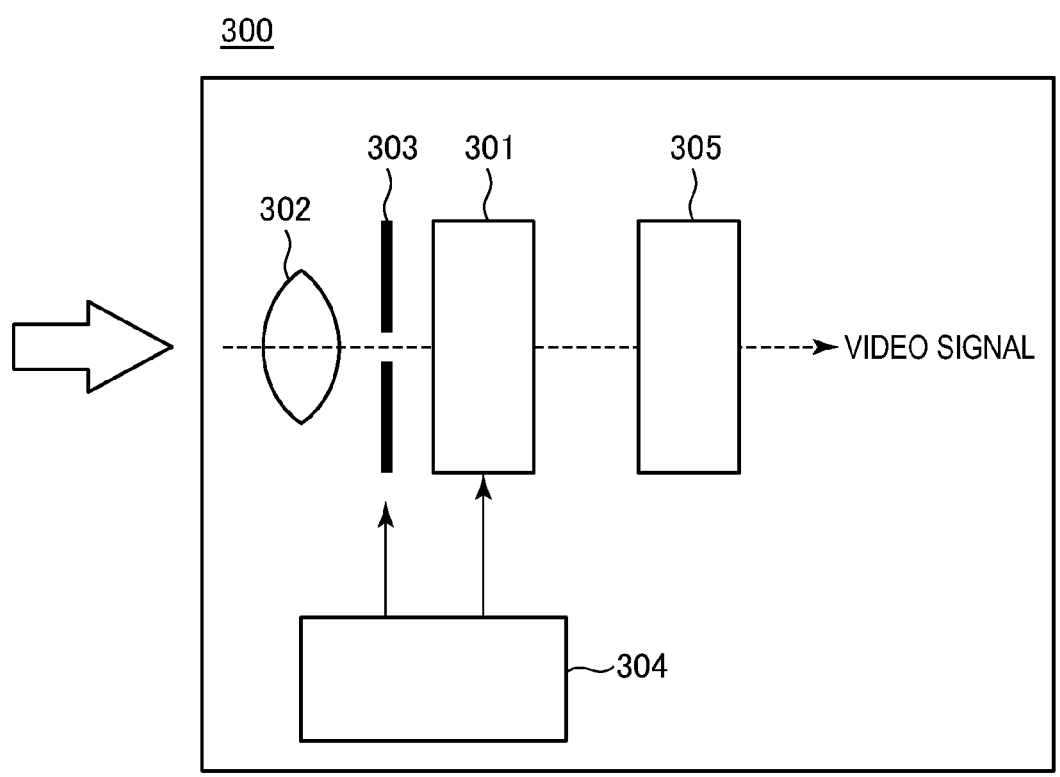
FIG. 10 is a figure which shows a configuration of an electronic apparatus.

FIG. 10 shows an example configuration of a video camera which can photograph a still image or a moving image. A camera 300 of this example includes a solid-state imaging apparatus 301, an optical system 302 which guides incident light to a light receiving sensor section of the solid-state imaging apparatus 301, a shutter device 303 arranged between the solid-state imaging apparatus 301 and the optical system 302, and a driving circuit 304 which drives the solid-state imaging apparatus 301. In addition, the camera 300 includes a signal processing circuit 305 which processes an output signal of the solid-state imaging apparatus 301.

The solid-state imaging apparatus 301 is fabricated by using the bonding technique of metal electrodes from the embodiments and the modified example according to the above described embodiment of the present disclosure. The configuration and function of each of the other sections are as follows.

The optical system (optical lens) 302 forms image light (incident light) from a photographic subject onto an imaging surface (not shown in the figure) of the solid-state imaging apparatus 301. In this way, a signal charge is stored, for a fixed period, in the solid-state imaging apparatus 301. Note that the optical system 302 may be configured by an optical lens group which includes a plurality of optical lenses. Further, the shutter device 303 controls a light irradiation period and a light shielding period for the incident light of the solid-state imaging apparatus 301.

The driving circuit 304 supplies a drive signal to the solid-state imaging apparatus 301 and the shutter device 303. Also, the driving circuit 304 controls a signal output operation to the signal processing circuit 305 of the solid-state imaging apparatus 301, and a shutter operation of the shutter device 303, according to the supplied drive signal. That is, in this example, a signal transfer operation is performed from the solid-state imaging apparatus 301 to the signal processing circuit 305, according to the drive signal (timing signal) supplied from the driving circuit 304.

The signal processing circuit 305 applies various signal processes to the signal transferred from the solid-state imaging apparatus 301. Also, the signal to which the various signal processes have been applied (video signal) is stored in a storage medium such as a memory (not shown in the figure), or is output to a monitor (not shown in the figure).

Additionally, the present technology may also be configured as below.

(1) A semiconductor device, including:
a semiconductor substrate;
an interlayer insulating layer formed on the semiconductor substrate;
a bonding electrode formed on a surface of the interlayer insulating layer; and
a metal film which covers an entire surface of a bonding surface including the interlayer insulating layer and the bonding electrode.

(2) The semiconductor device according to (1),
wherein the metal film includes a metal material which becomes an insulator due to a reaction with the interlayer insulating layer.

(3) The semiconductor device according to (1) or (2),
wherein the metal film includes at least one type selected from Ta or Ti.

(4) A semiconductor device including a first semiconductor substrate and a second semiconductor substrate which are formed by laminating surfaces of bonding electrodes through metal films, the semiconductor device including:
the first semiconductor substrate;
a first interlayer insulating layer formed on the first semiconductor substrate;
a first bonding electrode formed on a surface of the first interlayer insulating layer;
the second semiconductor substrate bonded to the first semiconductor substrate;
a second interlayer insulating layer formed on the second semiconductor substrate;
a second bonding electrode formed on a surface of the second interlayer insulating layer;
a metal film formed on a bonding surface between the first semiconductor substrate and the second semiconductor substrate, and between the first bonding electrode and the second bonding electrode; and
an insulating film which is formed on the bonding surface between the first semiconductor substrate and the second semiconductor substrate, and on a part in contact with the first interlayer insulating layer or the second interlayer insulating layer, and which includes a reaction product between the metal film and the first interlayer insulating layer or the second interlayer insulating layer.

(5) The semiconductor device according to (4), further including:
a first metal film formed on the first bonding electrode of the first semiconductor substrate;
a first insulating film which is formed on the first interlayer insulating layer, and which includes a reaction product between the first metal film and the first interlayer insulating layer or the second interlayer insulating layer;
a second metal film formed on the second bonding electrode of the second semiconductor substrate; and
a second insulating film formed on the second interlayer insulating layer, and which includes a reaction product between the second metal film and the first interlayer insulating layer or the second interlayer insulating layer.

(6) A method for manufacturing a semiconductor device, comprising:
forming an interlayer insulating layer on a semiconductor substrate;
forming a bonding electrode on a surface of the interlayer insulating layer; and
forming a metal film on an entire surface of the interlayer insulating layer and the bonding electrode.

(7) An electronic apparatus, including:
the semiconductor device according to any one of (1) to (5); and
a signal processing circuit which processes an output signal of the semiconductor device.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-029429 filed in the Japan Patent Office on Feb. 14, 2012, the entire content of which is hereby incorporated by reference.

What is claimed is:
1. A semiconductor device, comprising:
a semiconductor substrate;
an interlayer insulating layer formed on the semiconductor substrate;
a bonding electrode formed in a surface of the interlayer insulating layer; and
a metal film layer which covers an entire surface of a planar bonding surface including the interlayer insulating layer and the bonding electrode, the metal film layer including an insulating film portion covering the interlayer insulating layer and a metal film portion covering the bonding electrode,
wherein the insulating film portion is a reaction product of a metal material of the metal film layer with the interlayer insulating layer.

2. The semiconductor device according to claim 1,
wherein the metal film layer includes at least one type selected from Ta or Ti.

3. The semiconductor device according to claim 1, further comprising a barrier surface layer between the interlayer insulating layer and the bonding electrode.

4. The semiconductor device according to claim 1, wherein a thickness of the metal film layer is equal to or less than 100 nm.

5. The semiconductor device according to claim 4, wherein the thickness of the metal film layer is equal to or less than 20 nm.

6. A semiconductor device including a first semiconductor substrate and a second semiconductor substrate which are formed by laminating surfaces of bonding electrodes through metal films, the semiconductor device comprising:

the first semiconductor substrate;
a first interlayer insulating layer formed on the first semiconductor substrate;
a first bonding electrode formed in a surface of the first interlayer insulating layer;
the second semiconductor substrate bonded to the first semiconductor substrate;
a second interlayer insulating layer formed on the second semiconductor substrate;
a second bonding electrode formed in a surface of the second interlayer insulating layer;
a metal film formed on a bonding surface between the first semiconductor substrate and the second semiconductor substrate, and between the first bonding electrode and the second bonding electrode; and
an insulating film which is formed on the bonding surface between the first semiconductor substrate and the second semiconductor substrate, and on a part in contact with the first interlayer insulating layer or the second interlayer insulating layer, and which includes a reaction product between the metal film and the first interlayer insulating layer or the second interlayer insulating layer.

7. The semiconductor device according to claim 6, further comprising:
a first metal film formed on the first bonding electrode of the first semiconductor substrate;
a first insulating film which is formed on the first interlayer insulating layer, and which includes a reaction product between the first metal film and the first interlayer insulating layer or the second interlayer insulating layer;
a second metal film formed on the second bonding electrode of the second semiconductor substrate; and
a second insulating film which is formed on the second interlayer insulating layer, and which includes a reaction product between the second metal film and the first interlayer insulating layer or the second interlayer insulating layer.

8. An electronic apparatus comprising:
the semiconductor device according to claim 6; and
a signal processing circuit which processes an output signal of the semiconductor device.

9. The electronic apparatus according to claim 8, further comprising:
a first metal film formed on the first bonding electrode of the first semiconductor substrate;
a first insulating film which is formed on the first interlayer insulating layer, and which includes a reaction product between the first metal film and the first interlayer insulating layer or the second interlayer insulating layer;
a second metal film formed on the second bonding electrode of the second semiconductor substrate; and
a second insulating film which is formed on the second interlayer insulating layer, and which includes a reaction product between the second metal film and the first interlayer insulating layer or the second interlayer insulating layer.

10. The semiconductor device according to claim 6, wherein the bonding surface is a planar surface.

11. The semiconductor device according to claim 6, further comprising
a first barrier surface layer between the first interlayer insulating layer and the first bonding electrode, and
a second barrier surface layer between the second interlayer insulating layer and the second bonding electrode.

12. An electronic apparatus, comprising:
a semiconductor device which includes
a semiconductor substrate,
an interlayer insulating layer formed on the semiconductor substrate,
a bonding electrode formed in a surface of the interlayer insulating layer, and
a metal film layer which covers an entire surface of a planar bonding surface including the interlayer insulating layer and the bonding electrode, the metal film layer including an insulating film portion covering the interlayer insulating layer and a metal film portion covering the bonding electrode,
wherein the insulating film portion is a reaction product of a metal material of the metal film layer with the interlayer insulating layer; and
a signal processing circuit which processes an output signal of the semiconductor device.

13. The electronic apparatus according to claim 12, wherein the metal film layer includes at least one type selected from Ta or Ti.

14. The electronic apparatus according to claim 12, further comprising a barrier surface layer between the interlayer insulating layer and the bonding electrode.

15. The electronic apparatus according to claim 12, wherein a thickness of the metal film layer is equal to or less than 100 nm.

16. The electronic apparatus according to claim 15, wherein the thickness of the metal film layer is equal to or less than 20 nm.

* * * * *